United States Patent
Danioni et al.

(10) Patent No.: US 7,816,968 B2
(45) Date of Patent: Oct. 19, 2010

(54) SIGNAL-PROCESSING CIRCUIT, IN PARTICULAR OPERATING AS A RECTIFIER AND PEAK DETECTOR, WITH ACTIVE ELEMENTS AND DIFFERENTIAL INPUTS

(75) Inventors: Alberto Danioni, Pavia (IT); Paolo Invernizzi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 149 days.

(21) Appl. No.: 11/833,874

(22) Filed: Aug. 3, 2007

(65) Prior Publication Data
US 2008/0030237 A1 Feb. 7, 2008

(30) Foreign Application Priority Data
Aug. 4, 2006 (EP) ................... 06425564

(51) Int. Cl.
*H03L 5/00* (2006.01)
(52) U.S. Cl. .............. 327/307; 327/330; 327/103
(58) Field of Classification Search ............. 327/306, 327/330, 50, 58, 103, 362, 307
See application file for complete search history.

(56) References Cited
U.S. PATENT DOCUMENTS

| | | | |
|---|---|---|---|
| 5,418,453 A | * | 5/1995 | Wise .............. 324/160 |
| 6,281,699 B1 | * | 8/2001 | Bishop .............. 324/765 |
| 6,573,785 B1 | * | 6/2003 | Callicotte et al. ......... 330/9 |
| 6,654,192 B1 | | 11/2003 | Bruccoleri et al. |
| 6,714,079 B2 | * | 3/2004 | Dessard et al. .......... 330/256 |
| 2003/0210035 A1 | | 11/2003 | Manlove et al. |

* cited by examiner

*Primary Examiner*—Dinh T. Le
(74) *Attorney, Agent, or Firm*—Lisa K. Jorgenson; Robert Iannucci; Seed IP Law Group PLLC

(57) ABSTRACT

A signal-processing circuit has a first and a second input, which receive a first and a second differential signal, a third input, which receives a common-mode signal, the first and second differential signals having an equal and substantially opposite trend with respect to the common-mode signal, and a first output supplying a first processed signal, equivalent to the first differential signal rectified with respect to the common-mode signal, and satisfying throughout its course a first relation of comparison with the common-mode signal. The processing circuit is provided with first formation means for formation of the first processed signal, which operate on the basis of the first differential signal, and second formation means for formation of the first processed signal, which operate on the basis of the second differential signal; the first and second formation means co-operate in the formation of the first processed signal.

42 Claims, 3 Drawing Sheets

SIGNAL-PROCESSING CIRCUIT, IN PARTICULAR OPERATING AS A RECTIFIER AND PEAK DETECTOR, WITH ACTIVE ELEMENTS AND DIFFERENTIAL INPUTS

BACKGROUND

1. Technical Field

The present invention relates to a signal-processing circuit of an analog type, in particular operating as a rectifier and peak detector, with active elements and differential inputs.

2. Description of the Related Art

Rectifier and peak-detector circuits are known which enable extraction from an analog signal (for example, a voltage signal) of information correlated to its mean amplitude or else to its peak value. In a known way, these circuits are generally based upon the use of unidirectional current-conduction means (for example, diodes) for rectifying the signal, and of charge-storage means (for example, capacitors) for detecting the peak value.

It is also common to use analog circuits of a fully-differential type, i.e., ones provided with pairs of differential inputs and outputs and in particular supplying at output a first differential signal $V_P(t)$ and a second differential signal $V_M(t)$, which have the same amplitude but are in phase opposition with respect to one another, and vary (in a way opposite with respect to one another) around a common-mode voltage $V_{CM}$. The use of fully-differential structures is advantageous in so far as it enables doubling of the dynamic range of the output signals and an automatic rejection of disturbance common to the two differential inputs. For example, circuit blocks of a fully-differential type are typically associated to the outputs of accelerometric sensors, gyroscopes, or other inertial sensors, for performing preliminary processing operations of corresponding output signals.

In particular, in some applications, it is required to obtain, from the pair formed by the first differential signal $V_P(t)$ and the second differential signal $V_M(t)$, a second pair of signals, a first peak signal $V_{pp}(t)$ and a second peak signal $V_{pm}(t)$, which are respectively equal to the positive peak (with respect to the common-mode signal $V_{CM}$) of the first differential signal $V_P(t)$ and to the negative peak (once again with respect to the common-mode signal $V_{CM}$) of the second differential signal $V_M(t)$.

FIG. 1 shows a peak-detector circuit 1 of a known type, having a first input 2a, a second input 2b, and a third input 2c, which receive, from a generic time-continuous and fully-differential analog block 3, respectively the first differential signal $V_P(t)$, the second differential signal $V_M(t)$, and the common-mode signal $V_{CM}$, which has a substantially constant value. The peak-detector circuit 1 has a first output 4a and a second output 4b on which it supplies, respectively, the first peak signal $V_{pp}(t)$ and the second peak signal $V_{pm}(t)$.

In detail, the peak-detector circuit 1 comprises a first detection circuit branch 1a and a second detection circuit branch 1b, which are identical to one another, are completely separate and independent, are connected to the first input 2a and to the second input 2b, respectively, and are both connected to the third input 2c.

Each detection circuit branch 1a, 1b comprises: an operational amplifier 5a, 5b having its non-inverting input connected to the first/second input 2a, 2b and its inverting input connected in feedback mode to the first/second output 4a, 4b; a diode 6a, 6b connected between the output of the operational amplifier 5a, 5b and the first/second output 4a, 4b (in particular, the diode 6a has its anode connected to the output of the corresponding amplifier 5a and its cathode connected to the first output 4a, and the diode 6b has its cathode connected to the second output 4b and its anode connected to the output of the corresponding amplifier 5b); a capacitor 8a, 8b, connected between the third input 2c and the anode/cathode of the corresponding diode 6a, 6b; and a current generator 9a, 9b connected between the first/second output 4a, 4b and, respectively, a reference voltage GND and a supply voltage $V_{DD}$.

Operation of the peak-detector circuit 1 (reference may be made also to FIG. 2 in which the waveforms of corresponding electrical signals are shown) is now described with specific reference to the first detection circuit branch 1a (but similar considerations may be applied to the second detection circuit branch 1b).

When the first differential signal $V_P(t)$ is higher than the first peak signal $V_{pp}(t)$ present on the first output 4a, the diode 6a conducts, and the current at output from the amplifier 5a charges the capacitor 8a, causing rising of the first peak signal $V_{pp}(t)$, which "follows" the first differential signal $V_P(t)$. As soon as the first differential signal $V_P(t)$ drops below the first peak signal $V_{pp}(t)$, current conduction through the diode 6a is interrupted, and the capacitor 8a discharges through the current generator 9a, which extracts a current having a very low intensity (so that the first peak signal $V_{pp}(t)$ will decrease very slowly). The flow of current that charges the capacitor 8a resumes as soon as the first differential signal $V_P(t)$ again exceeds the value of the first peak signal $V_{pp}(t)$, which coincides with the value of the residual voltage on the capacitor 8a added to the common-mode voltage $V_{CM}$.

Operation of the second detection circuit branch 1b is similar, with the difference that the flow of current at output from the amplifier 5b discharges the corresponding capacitor 8b when the second differential signal $V_M(t)$ is lower than the second peak signal $V_{pm}(t)$ present on the second output 4b, and the current supplied by the current generator 9b charges the capacitor 8b.

It is evident that in both of the circuit branches the first and second current generators 9a, 9b can be constant-current sources or else can be replaced with resistors.

The circuit described has a number of drawbacks. In the first place, a problem is represented by the high area occupation, due to the need to replicate twice one and the same peak-detector circuit. In fact, the two differential signals at input are used separately for detecting the positive peak signal and the negative peak signal. In addition, the two detection circuit branches 1a, 1b are separate and independent, and there consequently exists the risk of "mismatch" between component values, which can cause offsets between the first and second peak signals $V_{pp}(t)$, $V_{pm}(t)$. In addition, each peak-detection circuit branch 1a, 1b functions as a half-wave rectifier, operating on just one peak (positive or negative) of the input voltage, respectively when $V_P(t) > V_{CM}$, or else when $V_M(t) < V_{CM}$. As compared to a full-wave rectifier, the amplitude of the output-voltage ripple (designated by r in FIG. 2) is evidently greater as the time of discharging/charging of the capacitor 8a, 8b increases.

BRIEF SUMMARY

One embodiment of the present invention provides a signal-processing circuit, in particular of a rectifier and/or peak-detector type, that enables the aforesaid problems and disadvantages to be overcome, either entirely or in part.

BRIEF DESCRIPTION OF THE SEVERAL VIEWS OF THE DRAWINGS

For a better understanding of the present invention, preferred embodiments thereof are now described, purely by way of non-limiting example and with reference to the attached plate of drawings, wherein.

DETAILED DESCRIPTION

Figure 1:
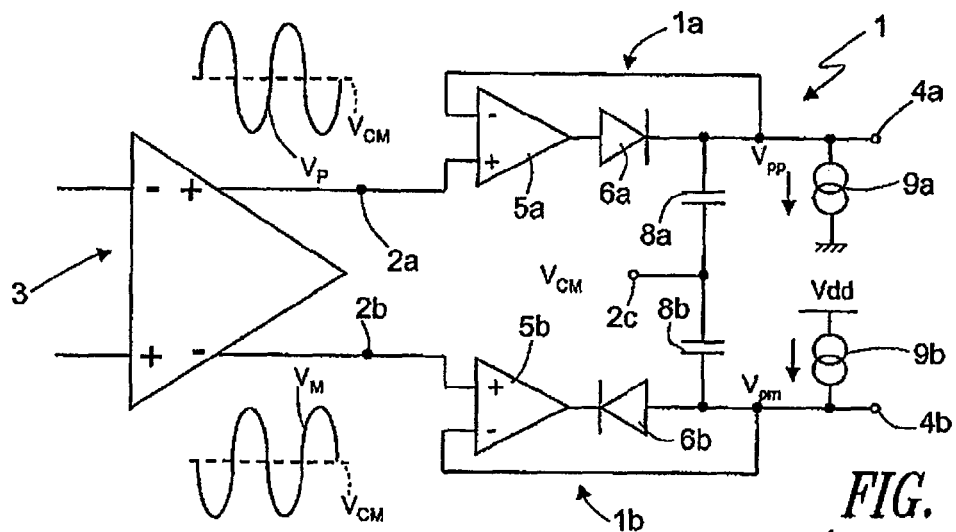
FIG. 1 shows a circuit diagram of a peak-detector circuit of a known type.
Figure 2:
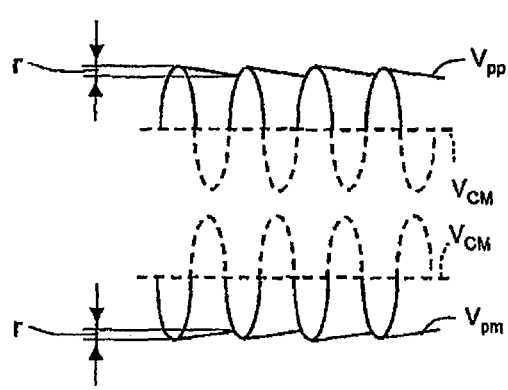
FIG. 2 shows waveforms of electrical quantities at output from the circuit of FIG. 1.
Figure 3:
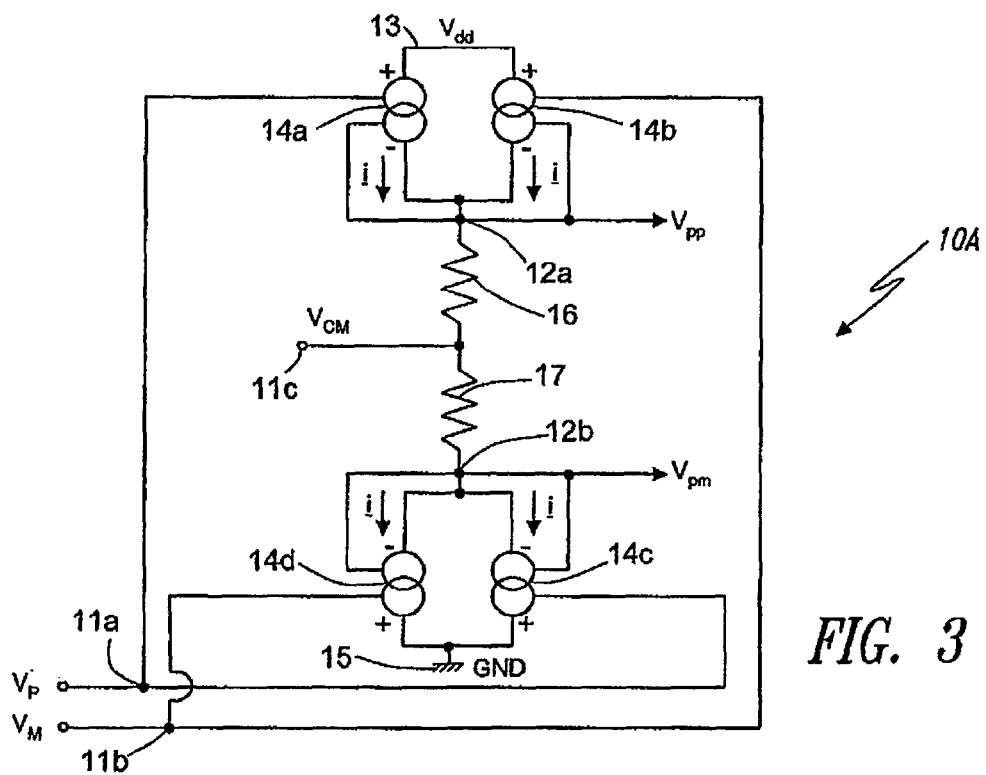
FIG. 3 shows a circuit block diagram of a signal-processing circuit, in particular of a rectifier type, according to one embodiment of the present invention.

As shown in FIG. 3, an analog signal-processing circuit (in particular of a rectifier type) made according to one embodiment of the present invention and designated by 10A, has a first input, a second input and a third input 11a-11c connected (in a way not illustrated) to the outputs of a circuit block of a fully-differential type (similar to the analog block 3 of FIG. 1). The first and second inputs 11a, 11b receive, respectively, a first differential signal $V_P(t)$ and a second differential signal $V_M(t)$ (in particular, voltage signals), which are equal in amplitude and in phase opposition with respect to one another, and the third input 11c receives a common-mode signal $V_{CM}$ (which is also a voltage signal). The differential signals $V_P(t)$, $V_M(t)$ have an equal and opposite trend with respect to the common-mode signal $V_{CM}$. For example (see also FIG. 5), the first and second differential signals $V_P(t)$, $V_M(t)$ have a sinusoidal waveform around the common-mode signal $V_{CM}$. The signal-processing circuit 10 has also a first output 12a and a second output 12b, present on which are a first processed signal $V_{pp}(t)$ and a second processed signal $V_{pm}(t)$ (in particular, rectified signals).

The signal-processing circuit 10 further comprises four current generators 14a-14d, which are voltage-controlled by the first differential signal $V_P(t)$ or by the second differential signal $V_M(t)$, and supply at output a unidirectional current flow, the value of which is a function of the value of the first differential signal $V_P(t)$ or the second differential signal $V_M(t)$.

In detail, a first current generator 14a is connected between a supply line 13, set at a supply voltage $V_{dd}$, and the first output 12a, and has a first control terminal and a second control terminal connected, respectively, to the first input 11a and to the first output 12a. The first current generator 14a is controlled by the voltage of the first differential signal $V_P(t)$ and is configured to supply at output a current, the value of which is correlated to the value of the first differential signal $V_P(t)$, only in the case where the first differential signal $V_P(t)$ is higher than the first processed signal $V_{pp}(t)$ (and than the common-mode signal $V_{CM}$). The second current generator 14b is also connected between the supply line 13 and the first output 12a, and has control terminals connected to the second input 11b and to the first output 12a so as to be controlled by the voltage of the second differential signal $V_M(t)$. In addition, the second current generator 14b is configured to supply at output a current, the value of which is correlated to the value of the second differential signal $V_M(t)$, in the case where the second differential signal $V_M(t)$ is higher than the first processed signal $V_{pp}(t)$. The third current generator 14c is connected between a reference-voltage line 15, set at a reference voltage GND, and the second output 12b, and has control terminals connected to the first input 11a and to the second output 12b. The third current generator 14c is controlled by the voltage of the first differential signal $V_P(t)$ and is configured to supply at output a current, the value of which is correlated to the value of the first differential signal $V_P(t)$, in the case where the first differential signal $V_P(t)$ is lower than the second processed signal $V_{pm}(t)$ (and than the common-mode signal $V_{CM}$). The fourth current generator 14d is also connected between the reference-voltage line 15 and the second output 12b, and has control terminals connected to the second input 11b and to the second output 12b so as to be controlled by the voltage of the second differential signal $V_M(t)$. The fourth current generator 14d is configured to supply at output a current, the value of which is correlated to the value of the second differential signal $V_M(t)$, in the case where the second differential signal $V_M(t)$ is lower than the second processed signal $V_{pm}(t)$.

The signal-processing circuit 10 further comprises a first resistor 16 and a second resistor 17, which have the same value of resistance and are connected between the third input 11c and, respectively, the first output 12a and the second output 12b. In particular, the first and second current generators 14a, 14b are configured to supply a generator current i to the first resistor 16 (in the direction indicated by the arrows in FIG. 3), and the third and fourth current generators 14c, 14d are configured to extract the generator current i from the second resistor 17 (once again in the direction indicated by the arrows).

Operation of the illustrated circuit is described in what follows, with initial reference to just the pair of current generators 14a, 14b.

As long as the first differential signal $V_P(t)$ is higher than the second differential signal $V_M(t)$ (or, equivalently, is higher than the common-mode signal $V_{CM}$), the first current generator 14a supplies the generator current i (proportional to the value of the first differential signal $V_P(t)$) in the direction indicated, towards the first resistor 16, and the first processed signal (in this case rectified) $V_{pp}(t)$ follows the pattern of the first differential signal $V_P(t)$. In this operating condition, the second current generator 14b is substantially off and does not supply current.

When, instead, the value of the second differential signal $V_M(t)$ exceeds that of the first differential signal $V_P(t)$ (or, in a similar way when the first differential signal $V_P(t)$ drops below the value of the common-mode signal $V_{CM}$, and the second differential signal $V_M(t)$ exceeds said value), the first current generator 14a turns off, and the second current generator 14b starts operating, and supplies in turn the generator current i (proportional to the value of the second differential signal $V_M(t)$) to the first resistor 16. In this operating condition, the first processed signal $V_{pp}(t)$ consequently follows the pattern of the second differential signal $V_M(t)$, and the first current generator 14a is substantially off and does not supply current.

Next, the first differential signal $V_P(t)$ exceeds again the value of the common-mode signal $V_{CM}$ and switches back on the first current generator 14a, and so on, the operation described being repeated for each half-wave of the differential input signals.

Figure 5:
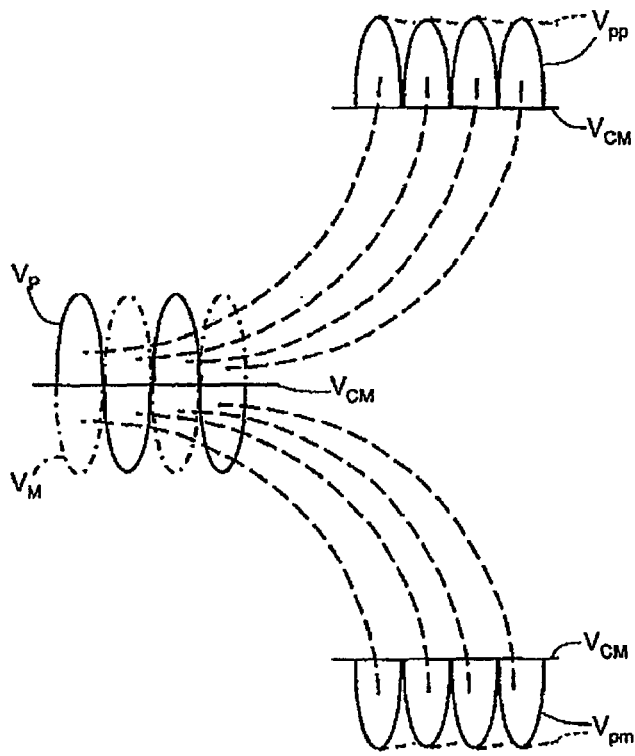
FIG. 5 shows waveforms of electrical quantities associated to the circuits of FIGS. 3 and 4.

As is represented with a solid line in FIG. 5, the first resulting processed signal $V_{pp}(t)$ is constituted by a continuous series of positive half-waves (i.e., higher than the common-mode signal $V_{CM}$), and hence corresponds to the first differential signal $V_P(t)$ (or, in an equivalent way, to the second differential signal $V_M(t)$, given the corresponding waveforms of the aforesaid signals) rectified with respect to its positive component. In fact, the rectifier circuit continuously "locks" to the positive half-sinusoids (i.e., the ones higher than the common-mode signal) alternatively of the first differential input signal and of the second differential input signal, and feeds them back onto the first output 12a. From the first processed signal $V_{pp}(t)$, it is hence possible (in a way known and for this reason not described in detail) to extract (for example, via an appropriate filtering) information linked to the mean amplitude of the differential input signals $V_P(t)$, $V_M(t)$.

Operation of the pair of current generators 14c, 14d, which absorb current from the second resistor 17, is altogether equivalent, the second processed signal $V_{pm}(t)$ provided on the second output 12b being consequently constituted by a series of negative half-sinusoids (i.e., lower than the common-mode signal $V_{CM}$), belonging alternatively to the first differential input signal or to the second differential input signal, and corresponding to the second differential signal $V_M(t)$ (or, equivalently to the first differential signal $V_P(t)$) rectified with respect to its negative component. Also in this case, from the second processed signal $V_{pm}(t)$ it is possible to extract information linked to the mean amplitude of the differential input signals.

Figure 4:
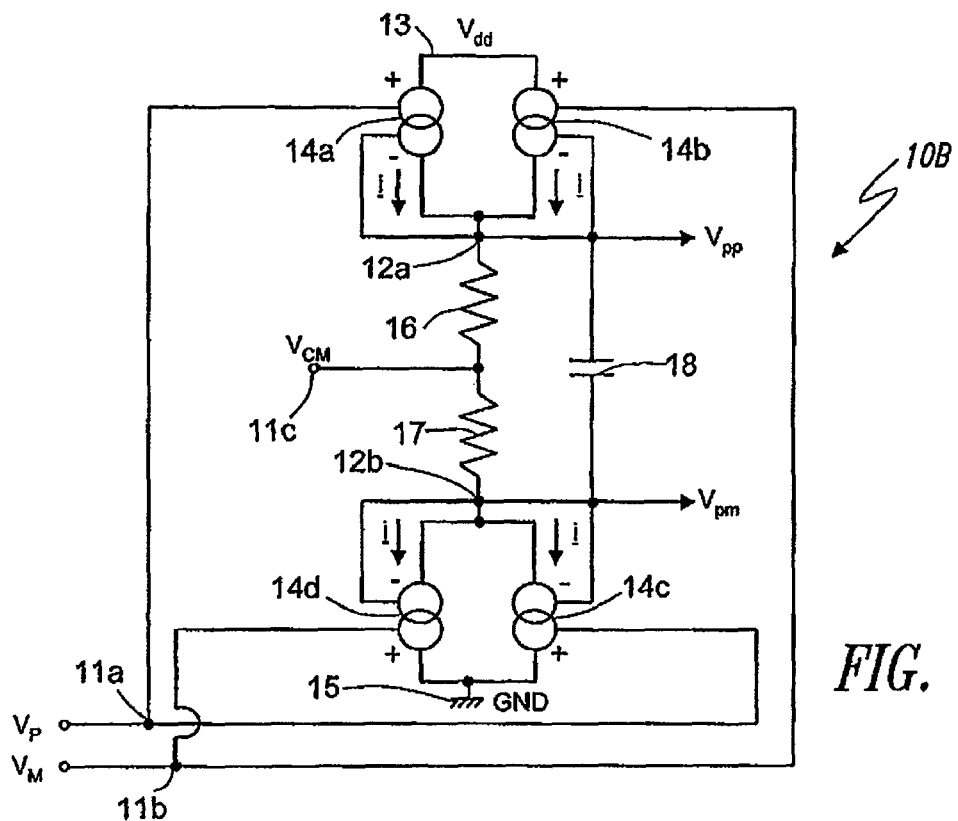
FIG. 4 shows a circuit block diagram of a signal-processing circuit, in particular of a peak-detector type, according to one embodiment of the present invention.

FIG. 4 shows a signal-processing circuit 10B made according to a further embodiment of the invention, which implements a peak rectifier of the differential input signals.

In detail, this circuit has the same characteristics as the rectifier circuit described previously, with just one difference constituted by the presence of a detection capacitor 18, connected between the first output 12a and the second output 12b. In the presence of the detection capacitor 18, operating as a memory element, the signal-processing circuit 10 behaves as a peak detector, detecting both the positive peak and the negative peak of the differential input signals.

In fact, due to the presence of this capacitor, the first processed signal $V_{pp}(t)$ (represented with a dashed line in FIG. 5, in this case a peak rectified signal) rises until it reaches the positive peak of the positive half-sinusoid of the first/second differential signals $V_P(t)$, $V_M(t)$, and then, instead of following the waveform of the half-sinusoid, decreases very slowly with the time constant determined basically by the capacitance of the detection capacitor 18 and the resistance of the first resistor 16. The signal rises again when the second/first differential signal $V_M(t)$, $V_P(t)$ becomes higher than the first processed signal $V_{pp}(t)$. In this case, the first and second current generators 14a, 14b are operational only during the time interval in which the first/second differential signals $V_P(t)$, $V_M(t)$ are effectively higher than the first processed signal $V_{pp}(t)$ present on the detection capacitor 18, consequently having a pulsed and non-continuous operation during the entire positive half-sinusoid.

Again, the same applies to the second processed signal $V_{pm}(t)$, which is also a peak rectified signal (represented with a dashed line in FIG. 5), which decreases until it reaches the negative peak of the negative half-sinusoid of the first differential signal $V_P(t)$ or of the second differential signal $V_M(t)$, and then rises very slowly towards the voltage value of the common-mode signal $V_{CM}$, according to the time constant determined by the capacitance of the detection capacitor 18 and the resistance of the second resistor 17 (also in this case, the third and fourth current generators 14c, 14d have a pulsed operation).

Figure 6:
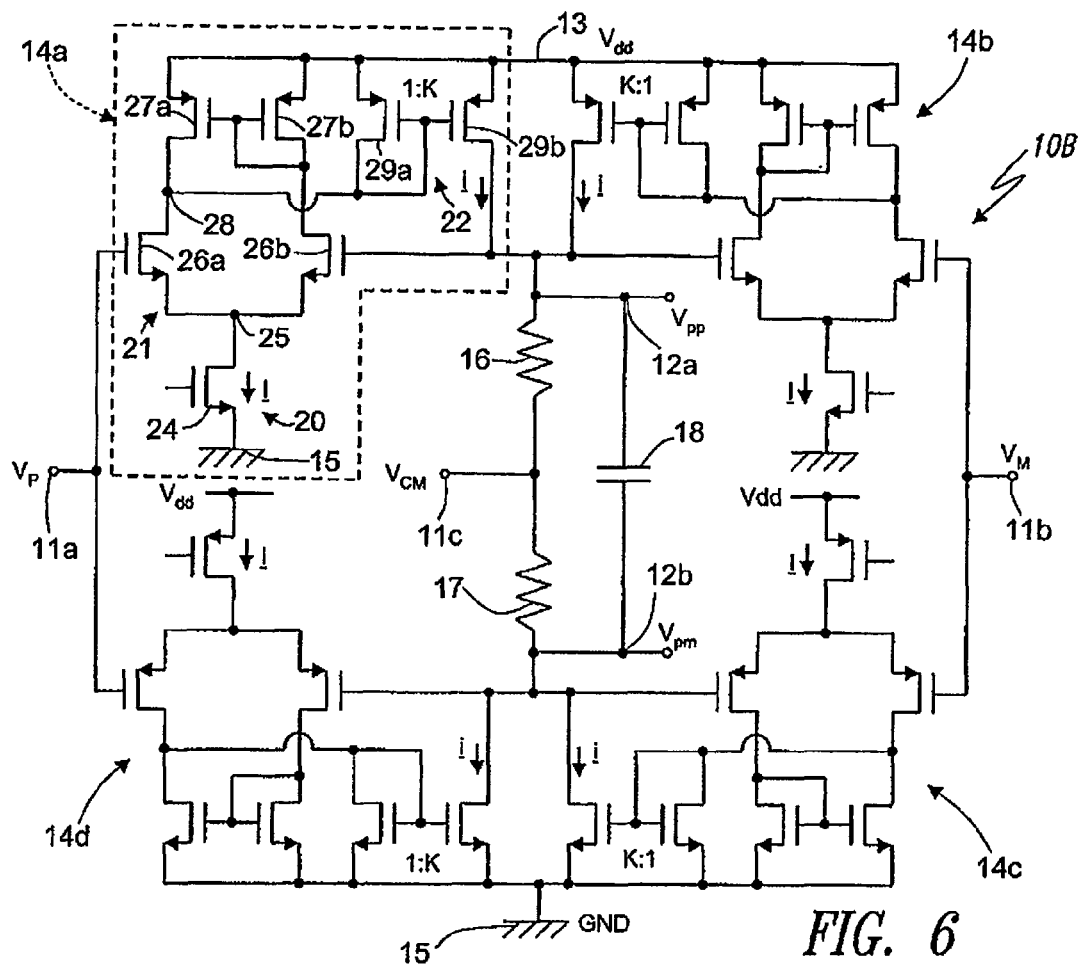
FIG. 6 shows a detailed circuit diagram of the circuit of FIG. 4.

FIG. 6 shows the detailed diagram of the signal-processing circuit 10 (when implementing a peak detector), in which the circuit architecture of the voltage-controlled current generators 14a-14d is highlighted. In particular, only the circuit structure of the first current generator 14a will be described in what follows, the structure of the other generators being altogether equivalent, except for the different connections (in any case already described with reference to FIG. 4).

In detail, the first current generator 14a is made with an active element, in particular an amplifier with unidirectional output-current flow, and comprises a biasing stage 20, a differential input stage 21, connected to the biasing stage 20, and a current-mirror stage 22, which is connected to the output of the differential input stage 21 and defines the first output 12a of the signal-processing circuit 10.

In detail, the biasing stage 20 comprises a biasing transistor 24, of an N-channel MOSFET type, having its gate terminal receiving a constant-voltage control signal from a biasing control circuit (not illustrated) of a value such as to maintain it in conduction, its source terminal connected to the reference-voltage line 15, and its drain terminal connected to a first internal node 25 of the circuit. A biasing current I, which is determined by the circuit configuration, flows in the biasing transistor 24.

The differential input stage 21 comprises a first differential transistor 26a and a second differential transistor 26b, of an N-channel MOSFET type, which have source terminals connected together and to the first internal node 25. The differential input stage 21 further comprises a first mirror transistor 27a and a second mirror transistor 27b, of a P-channel MOSFET type, which define a current mirror with unit gain ratio.

In greater detail, the first differential transistor 26a has its gate terminal which is connected to the first input 11a of the circuit and receives the first differential signal $V_P(t)$, and its drain terminal which is connected to the drain terminal of the first mirror transistor 27a and also defines a differential output 28 of the differential input stage 21. The second differential transistor 26b has its gate terminal connected to the first output 12a, and its drain terminal connected to the drain terminal of the second mirror transistor 27b. The first mirror transistor 27a also has its source terminal connected to the supply line 13 and to the source terminal of the second mirror transistor 27b, and its gate terminal connected to the gate terminal and to the drain terminal of the same second mirror transistor 27b (which is hence diode-connected).

The current-mirror stage 22 is configured to define a mirror ratio 1:K (K designating the mirror factor) between the current at output from the differential-input stage 21 and the generator current i supplied (in a unidirectional way) on the first output 12a.

In detail, this stage comprises a third mirror transistor 29a and a fourth mirror transistor 29b, of a P-channel MOSFET type. The third mirror transistor 29a has its drain terminal connected to the differential output 28 and to the gate terminal of the same transistor (which is hence diode-connected), its source terminal connected to the source terminal of the fourth mirror transistor 29b and to the supply line 13, and its gate terminal connected to the gate terminal of the same fourth mirror transistor 29b. The fourth mirror transistor 29b moreover has its drain terminal connected to the first output 12a and supplying the generator current i.

When the voltage of the first differential signal $V_P(t)$ is higher than the first processed signal $V_{pp}(t)$, the unbalancing of the pair of input differential transistors causes the biasing current I to circulate in the first differential transistor 26a and to reach the differential output 28. This current is then mirrored by the current-mirror stage 22 and defines (increased by the mirror factor K) the generator current i. Instead, when the voltage of the first differential signal $V_P(t)$ is lower than the first processed signal $V_{pp}(t)$, the biasing current I circulates through the second differential transistor 26b and does not reach the current-mirror stage 22 through the differential output 28. It follows that the first current generator 14a does not supply a significant current on the first output 12a.

The first current generator 14a is hence indeed driven by the voltage of the first differential signal $V_P(t)$ and enables a unidirectional current flow towards the first resistor 16 only in the case where the same differential signal is higher than the value of the first processed signal $V_{pp}(t)$.

In particular, in small-signal regime, the generator current i can be expressed as:

$$i = g_m \cdot K \cdot v_d$$

where $g_m$ is the transconductance gain of the differential-input stage 21, K is the aforesaid mirror factor, and $v_d$ is the differential unbalancing voltage of the pair of differential transistors 26a, 26b.

As previously highlighted, the structure and operation of the other current generators 14b-14d are substantially equivalent. It is pointed out only that the third and fourth current generators 14c, 14d have MOSFET transistors with opposite channel, in so far as the generator current i is in this case extracted by the second resistor 17.

From what has been described and illustrated, the advantages of the signal-processing circuit according to one embodiment of the invention are evident.

In particular, the circuit described enables detection of an (maximum and minimum) amplitude peak of voltage signals coming from an analog circuit block with differential output. In addition, this circuit can implement a full-wave rectifier (or double half-wave rectifier), by rectifying the signals at output from the analog block that precedes it with respect to their common-mode voltage. As may be appreciated from the above description, the advantage of this circuit derives from the joint use, for the formation of the processed output signal, of both differential input signals $V_p(t)$ and $V_m(t)$, exploiting both of the half-waves, i.e., the positive one and the negative one, of these signals. In particular, for the formation of the processed signal $V_{pp}(t)$, $V_{pm}(t)$, the first differential signal $V_p(t)$ or the second differential signal $V_m(t)$ are used alternatively, when they satisfy a desired relation of comparison with the same processed signal. At each half-wave one pair of the four current generators 14a-14d controlled by the voltage of the differential input signals (for example, the first current generator 14a and the third current generator 14c) is in conduction, and at the subsequent half-wave the other pair of the same generators (in the example, the second current generator 14b and the fourth current generator 14d) is in conduction, so that both the positive rectified signal and the negative rectified signal are supplied at output. The difference thus emerges clearly with respect to traditional rectifier/peak-detector circuits, in which only one input signal is used for processing (in the case of differential signals, only the first differential signal $V_P(t)$ or the second differential signal $V_m(t)$).

The circuit advantageously acts as a full-wave rectifier. Consequently, given the same component values (in particular of the resistors and of the capacitor), it is possible to have a ripple on the voltages of the first and second processed signals $V_{pp}(t)$, $V_{pm}(t)$ that is reduced as compared to traditional circuits (for example, of the type illustrated in FIG. 1); or else, given the same ripple amplitude, it is possible to use passive components having a lower value.

In addition, the signal-processing circuit 10 is a single integrated circuit that can be made in a single die of semiconductor material. This characteristic, in addition to leading to a reduction of area occupation with respect to traditional solutions, improves matching between the components and the signal paths. In particular, the various transistors implementing the controlled current generators are formed in a interdigited configuration within the die, and are consequently effectively closely matched.

Moreover, it is straightforward to vary the mirror factor K of the current-mirror stage 22 of the current generators 14a-14d on the basis of the dynamic performance required of the circuit and of the load to be driven.

Figure 7:
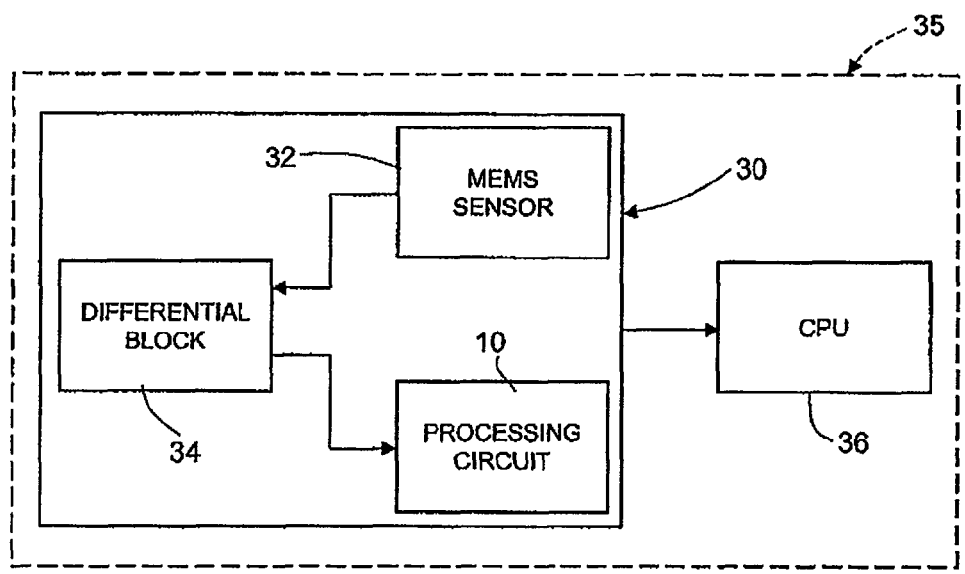
FIG. 7 shows a simplified block diagram of an electronic device incorporating the signal-processing circuit according to one embodiment of the invention.

As shown schematically in FIG. 7, the signal-processing circuit 10 can advantageously be used in an electronic device 30, which incorporates a MEMS sensor 32 (for example an accelerometer, a gyroscope, or a magnetometer). The MEMS sensor 32 comprises a detection structure of a microelectromechanical type (provided in a known way with at least one mobile mass free to move with external stresses), and is associated to a fully-differential analog block 34 for performing a first conditioning of the detected signals. The signal-processing circuit 10 is connected to the output of the fully-differential analog block 34 for detecting information correlated to the amplitude (for example, to the peak amplitude) of the signals detected and processed. For example, in a known way, the presence of a peak detector is advantageous in the actuation loop of a MEMS gyroscope, since for the control of the gyroscope it is helpful to know the maximum amplitude of the velocity oscillations of the mobile mass of the detection structure.

There is a wide range of electronic systems 35 in which the electronic device 30 can find advantageous application: for example, GPS systems, in which with the aid of MEMS sensors (such as gyroscopes, accelerometers, etc.) it is possible to trace the position of a person even when the satellite link is not usable; automotive systems, in which accelerometers and gyroscopes supply aid-to-drive information; video-acquisition systems (for example cameras or camcorders) in which gyroscopes can be used for correcting trembling of the user's hand when the resolution exceeds a given level (for example, 4-5 Mpix). The above systems typically comprise a control unit 36 (for example, a microprocessor control unit), supervising their operation; the control unit 36 is connected to the electronic device 30, and acquires the aforesaid amplitude information from the signal-processing circuit 10.

Finally, it is clear that modifications and variations can be made to what is described and illustrated herein without thereby departing from the scope of the present invention, as defined in the annexed claims.

In particular, the circuit may comprise only a pair of current generators and just one resistor (in particular, the first and second current generators 14a-14b and the first resistor 16, or else the third and fourth current generators 14c-14d and the second resistor 17), in the case where it is desired to obtain at output only a rectified signal (or peak rectified signal), that is positive or negative with respect to the common-mode signal $V_{CM}$.

In addition, there could be advantageously envisaged the presence of two controlled switches between the first output 12a and the second output 12b, and a respective terminal of the detection capacitor 18 so as to connect or disconnect the detection capacitor 18 to/from the circuit and thus selectively implement the function of rectifier or of peak detector.

The first and second differential signals $V_P$, $V_M$ could have a waveform different from the sinusoidal waveform described, albeit having opposite variations (i.e., being in phase opposition) with respect to the common-mode signal $V_{CM}$.

Finally, the aforesaid first and second differential signals, with the highlighted features, could even not come from a fully-differential analog block, but be generated in any other way in itself known.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A signal-processing circuit, comprising:
   first and second inputs configured to receive first and second differential signals, respectively;
   a third input connected to a first end of a first resistor and configured to receive a common-mode signal, said first and second differential signals having substantially opposite phase with respect to each other;
   a first output connected to a second end of the first resistor and configured to supply a first processed signal;
   first formation means, coupled to said first output, for forming said first processed signal at said first output, which are configured to operate based on said first differential signal and said common mode signal; and
   second formation means, coupled to said first output, for forming said first processed signal at said first output, which are configured to operate based on said second differential signal and said common mode signal, said first and second formation means being configured to co-operate in forming said first processed signal, wherein each of said first and second formation means comprise a respective controlled current generator, the controlled current generators being controlled, respectively, by a respective one of said first and second differential signals, and configured to supply through said first resistor a unidirectional generator current having respective values that are a function, respectively, of a respective one of said first differential signal and of said second differential signal.

2. The circuit according to claim 1, wherein said first formation means are configured to operate when said first differential signal exceeds said first processed signal and the second formation means are configured to operate when said second differential signal exceeds said first processed signal.

3. The circuit according to claim 1, wherein:
   said first formation means comprise a first controlled current generator of the controlled current generators, the first controlled current generator being connected to said first output, the first controlled current generator being voltage-controlled by said first differential signal;
   said second formation means comprise a second controlled current generator of the controlled current generators, the second controlled current generator being connected to said first output and voltage-controlled by said second differential signal.

4. The circuit according to claim 3, wherein:
   said first controlled current generator has first and second control terminals connected, respectively, to said first input and to said first output;
   said second controlled current generator has respective first and second control terminals connected, respectively, to said second input and to said first output;
   said first controlled current generator supplies current to said first resistor when said first differential signal exceeds said first processed signal; and
   said second controlled current generator supplies current to said first resistor when said second differential signal exceeds said first processed signal.

5. The circuit according to claim 1, wherein said first processed signal is a full-wave rectified signal.

6. The circuit according to claim 1, wherein:
   said first processed signal is a peak rectified signal; and
   said first and second formation means further comprise a capacitor connected to said first output.

7. The circuit according to claim 1, further comprising:
   a second output configured to supply a second processed signal;
   third formation means coupled to said second output for forming said second processed signal at said second output, which are configured to operate based on said second differential signal and said common mode signal; and
   fourth formation means coupled to said second output for forming said second processed signal at said second output, which are configured to operate based on said first differential signal and said common mode signal, said third and fourth formation means being configured to co-operate in the formation of said second processed signal.

8. The circuit according to claim 7, wherein:
   said third formation means are configured to operate when said second differential signal is less than said second processed signal;
   said fourth formation means are configured to operate when said first differential signal is less than said second processed signal; and
   said first and said third formation means are configured to operate substantially simultaneously in a first operating interval, and said second and said fourth formation means are configured to operate substantially simultaneously in a second operating interval, substantially distinct from said first operating interval.

9. The circuit according to claim 7, further comprising:
   a second resistor having a first end coupled to the third input and a second end coupled to the second output, wherein:
   said third formation means comprise a third controlled current generator connected to said second output and voltage-controlled by said second differential signal; and
   said fourth formation means comprise a fourth controlled current generator connected to said second output and voltage-controlled by said first differential signal.

10. The circuit according to claim 9, wherein:
    said third controlled current generator has respective first and second control terminals connected, respectively, to said second input and to said second output; and said fourth controlled current generator has respective first and second control terminals connected, respectively, to said first input and to said second output.

11. The circuit according to claim 7, wherein said first, second, third and fourth formation means are arranged in one and the same integrated circuit within one and the same die of semiconductor material, in such a manner that corresponding electrical characteristics are closely matched.

12. The circuit according to claim 1, wherein said respective controlled current generators are provided with respectively amplifiers, with unidirectional current flow controlled by a respective one of said first and second differential signals.

13. The circuit according to claim 12, wherein each controlled current generator comprises:
   a differential input stage having first and second inputs and an output, the first and second inputs being configured to receive said respective one of said first and second differential signals and said first processed signal, respectively, and the differential input stage being configured to supply at the output of the differential input stage a differential current correlated to a difference between said respective one of said first and second differential signals and said first processed signal; and
   a current-mirror stage having an input coupled to said differential input stage and an output coupled to said first output and configured to mirror said differential current with a mirror factor, generating said unidirectional current flow.

14. The circuit according to claim 13, wherein each controlled current generator further comprises a biasing stage connected to said differential input stage of the current generator and configured to supply to said differential input stage of the controlled current generator a biasing current that is a function of said respective one of said first and second differential signals.

15. The circuit according to claim 14, wherein said differential input stage comprises:
   a first differential transistor and a second differential transistor, which are connected to said biasing stage and have respective control terminals, which receive, respectively, said respective one of said first and second differential signals and said first processed signal; and
   a first mirror transistor and a second mirror transistor connected between a reference-voltage line and, respectively, said first differential transistor and said second differential transistor, said first and second mirror transistors forming a current mirror supplying said differential current to said current-mirror stage.

16. An electronic device, comprising:
   a signal-processing circuit, the signal processing circuit including:
   first and second inputs configured to receive first and second differential signals, respectively;
   a third input connected to a first end of a first resistor and configured to receive a common-mode signal, said first and second differential signals having substantially opposite phase with respect to each other;
   a first output connected to a second end of the first resistor and configured to supply a first processed signal;
   first formation means coupled to said first output for forming said first processed signal at said first output, which are configured to operate based on said first differential signal and said common mode signal; and
   second formation means coupled to said first output for forming said first processed signal at said first output, which are configured to operate based on said second differential signal and said common mode signal, said first and second formation means being configured to co-operate in forming said first processed signal, wherein each of said first and second formation means comprise a respective controlled current generator, the controlled current generators being controlled, respectively, by a respective one of said first and second differential signals, and configured to supply said first resistor with a unidirectional generator current having values that are a function, respectively, of said first differential signal and of said second differential signal.

17. The device according to claim 16, comprising:
   a microelectromechanical detector configured to generate electrical quantities as a function of a quantity to be detected; and
   a differential processing block connected to said detector and configured to generate, as a function of said generated electrical quantities, said first and second differential signals and said common-mode signal for said signal-processing circuit.

18. The device according to claim 17, wherein said detector includes an inertial sensor.

19. A signal-processing method, comprising:
   providing first and second differential signals for first and second controlled current generators and a common-mode signal for said first and second controlled current generators through a first resistor, said first and second differential signals having substantially opposite phases with respect to each other; and
   connecting a first output terminal to a node between the first and second controlled current generators and the first resistor for providing a first processed signal jointly based on said first differential signal, said second differential signal, and said common mode signal; and
   wherein said first and second controlled current generators, controlled, respectively, by said first and second differential signals and said common mode signal to supply said first resistor with a unidirectional generator current having a value that is a function, respectively, of said first differential signal and of said second differential signal and said common mode signal.

20. The method according to claim 19, further comprising:
   forming at a second output a second processed signal jointly based on the first and second differential signals and said common mode signal, said step of forming a second processed signal including:
   forming at the second output first portions of said second processed signal based on said first differential signal and said common mode signal by substantially following the pattern of said first differential signal when said first differential signal satisfies a second relation with respect to said second processed signal; and
   forming at the second output second portions of said second processed signal based on said second differential signal by substantially following the pattern of said second differential signal when said second differential signal satisfies said second relation with respect to said second processed signal.

21. The method according to claim 19, wherein forming the first processed signal comprises supplying to the first resistor a unidirectional generator current having a value that is a function of said first differential signal in a first operating condition and a function of said second differential signal in a second operating condition.

22. The method according to claim 21, wherein said first operating condition corresponds to a condition in which said first differential signal satisfies said first relation with respect to said first processed signal, and said second operating condition corresponds to a condition in which said second differential signal satisfies said first relation with respect to said first processed signal.

23. A method comprising:
providing a first input signal and a second input signal in phase opposition to the first input signal for first and second controlled current generators and a common signal for said first and second controlled generators through a first resistor and a second resistor which are respectively connected to first and second output nodes of the first and second controlled current generators;
generating a first current through the first resistor connected to the first output node while a voltage of the first input signal is greater than a first output voltage on the first output node; and
generating a second current through the second resistor while a voltage of the second input signal is greater than a second output voltage, wherein the second resistor is connected between the first resistor and a second output node, the first and second resistors being in series with each other, and wherein a capacitor is connected between the first and second output nodes.

24. The method of claim 23 wherein a common mode node between the first and second resistors is held at a common mode voltage level.

25. The method of claim 24 comprising:
generating third and fourth currents through the second resistor while either the first or second input voltage is lower than a second output voltage on the second output node; and
maintaining the second output voltage at a level representative of a second peak of the first and second voltage opposite to the first peak of the first and second voltage by storing charge on the capacitor.

26. The method of claim 25 wherein the first and second resistors are equal to each other.

27. The method of claim 25 wherein the first and second currents are equal to each other.

28. The method of claim 23 comprising maintaining the first output voltage at a level representative of a first peak of the first and second voltage by storing charge on the capacitor.

29. A signal-processing circuit, comprising:
first and second inputs configured to receive first and second differential signals, respectively;
a third input configured to receive a common-mode signal, said first and second differential signals having substantially opposite phase with respect to each other;
a first output configured to supply a first processed signal;
first formation means coupled to said first output for forming said first processed signal at said first output, which are configured to operate based on said first differential signal; and
second formation means coupled to said first output for forming said first processed signal at said first output, which are configured to operate based on said second differential signal, said first and second formation means being configured to co-operate in forming said first processed signal, wherein:
said first formation means comprise a first resistor connected between said first output and said third input, and a first controlled current generator connected to said first output, the first current generator being voltage-controlled by said first differential signal;
said second formation means comprise said first resistor and a second controlled current generator connected to said first output and voltage-controlled by said second differential signal.

30. The circuit according to claim 29, wherein:
said first controlled current generator has first and second control terminals connected, respectively, to said first input and to said first output;
said second controlled current generator has respective first and second control terminals connected, respectively, to said second input and to said first output;
said first controlled current generator supplies current to said first resistor when said first differential signal exceeds said first processed signal; and
said second controlled current generator supplies current to said first resistor when said second differential signal exceeds said first processed signal.

31. A signal-processing circuit, comprising:
first and second inputs configured to receive first and second differential signals, respectively;
a third input configured to receive a common-mode signal, said first and second differential signals having substantially opposite phase with respect to each other;
a first output configured to supply a first processed signal;
first formation means coupled to said first output for forming said first processed signal at said first output, which are configured to operate based on said first differential signal and said common mode signal;
second formation means coupled to said first output for forming said first processed signal at said first output, which are configured to operate based on said second differential signal and said common mode signal, said first and second formation means being configured to co-operate in forming said first processed signal;
a second output configured to supply a second processed signal;
third formation means coupled to said second output for forming said second processed signal at said second output, which are configured to operate based on said second differential signal and said common mode signal; and
fourth formation means coupled to said second output for forming said second processed signal at said second output, which are configured to operate based on said first differential signal and said common mode signal, said third and fourth formation means being configured to co-operate in the formation of said second processed signal; and
wherein a first resistor is coupled between the third input and the first output and a second resistor is coupled between the third input and the second output.

32. The circuit according to claim 31, wherein:
said third formation means are configured to operate when said second differential signal is less than said second processed signal;
said fourth formation means are configured to operate when said first differential signal is less than said second processed signal; and
said first and said third formation means are configured to operate substantially simultaneously in a first operating interval, and said second and said fourth formation means are configured to operate substantially simultaneously in a second operating interval, substantially distinct from said first operating interval.

33. The circuit according to claim 31, wherein
said third formation means comprise a third controlled current generator connected to said second output and voltage-controlled by said second differential signal; and
said fourth formation means comprise a fourth controlled current generator connected to said second output and voltage-controlled by said first differential signal.

34. The circuit according to claim 33, wherein:
said third current generator has respective first and second control terminals connected, respectively, to said second input and to said second output; and
said fourth current generator has respective first and second control terminals connected, respectively, to said first input and to said second output.

35. A signal-processing circuit, comprising:
first and second inputs configured to receive first and second differential signals, respectively;
a third input connected to a first end of a first resistor and configured to receive a common-mode signal, said first and second differential signals having substantially opposite phase with respect to each other;
a first output connected to a second end of the first resistor and configured to supply a first processed signal;
first formation means coupled to said first output for forming said first processed signal at said first output, which are configured to operate based on said first differential signal and said common mode signal; and
second formation means coupled to said first output for forming said first processed signal at said first output, which are configured to operate based on said second differential signal and said common mode signal, said first and second formation means being configured to co-operate in forming said first processed signal, wherein each of said first and second formation means comprise a respective controlled current generator, provided with a respective amplifier, with unidirectional current flow controlled by a respective one of said first and second differential signals.

36. The circuit according to claim 35, wherein each current generator comprises:
a differential input stage having first and second inputs and an output, the first and second inputs being configured to receive said respective one of said first and second differential signals and said first processed signal, respectively, and the differential input stage being configured to supply at the output of the differential input stage a differential current correlated to a difference between said respective one of said first and second differential signals and said first processed signal; and
a current-mirror stage having an input coupled to said differential input stage and an output coupled to said first output and configured to mirror said differential current with a mirror factor, generating said unidirectional current flow.

37. A signal processing circuit, comprising:
first and second input nodes configured to receive first and second differential signals, respectively;
a third input node configured to receive a common-mode signal;
a first output node configured to supply a first processed signal;
a first resistor coupled between the third input node and the first output node;
a first current generator having a first control input coupled to the first input node, a second control input coupled to the first output node, and an output coupled to the first output node; and
a second current generator having a first control input coupled to the second input node, a second control input coupled to the first output node, and an output coupled to the first output node.

38. The signal processing circuit of claim 37, wherein the first current generator is configured to provide first portions of the first processed signal when the first differential signal exceeds the first processed signal and the second current generator is configured to provide second portions of the first processed signal when the second differential signal exceeds the first processed signal.

39. The signal processing circuit of claim 37, further comprising:
a second output node configured to supply a second processed signal;
a second resistor coupled between the third input node and the second output node;
a third current generator having a first control input coupled to the first input node, a second control input coupled to the second output node, and an output coupled to the second output node; and
a fourth current generator having a first control input coupled to the second input node, a second control input coupled to the second output node, and an output coupled to the second output node.

40. The signal processing circuit of claim 39, further comprising:
a capacitor coupled between the first and second output node.

41. The signal processing circuit of claim 39, wherein the third current generator is configured to provide first portions of the second processed signal when the first differential signal is less than the second processed signal and the second current generator is configured to provide second portions of the second processed signal when the second differential signal is less than the second processed signal.

42. The signal processing circuit of claim 37, wherein each current-generators comprises:
a differential input stage having a first input coupled to the first input node, a second input coupled to the first output node, and an output, the differential input stage being configured to supply at the output of the differential input stage a differential current correlated to a difference between the first differential signal and the first processed signal; and
a current mirror having an input coupled to the output of the differential input stage and an output coupled to said first output node and configured to mirror said differential current with a mirror factor.

* * * * *